(12) United States Patent
Lee

(10) Patent No.: US 9,343,404 B2
(45) Date of Patent: May 17, 2016

(54) ANTI-FUSE OF SEMICONDUCTOR DEVICE, SEMICONDUCTOR MODULE AND SYSTEM EACH INCLUDING THE SEMICONDUCTOR DEVICE, AND METHOD FOR FORMING THE ANTI-FUSE

(71) Applicant: SK hynix Inc., Icheon (KR)

(72) Inventor: Eun Sung Lee, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/613,188

(22) Filed: Feb. 3, 2015

(65) Prior Publication Data

US 2015/0155235 A1    Jun. 4, 2015

Related U.S. Application Data

(62) Division of application No. 13/717,553, filed on Dec. 17, 2012, now Pat. No. 8,981,525.

(30) Foreign Application Priority Data

Jul. 16, 2012 (KR) .................. 10-2012-0077260

(51) Int. Cl.
  *H01L 23/525* (2006.01)
  *G11C 17/16* (2006.01)
  *G11C 29/00* (2006.01)
  *H01L 27/112* (2006.01)

(52) U.S. Cl.
  CPC ............ *H01L 23/5252* (2013.01); *G11C 17/16* (2013.01); *G11C 29/785* (2013.01); *G11C 29/787* (2013.01); *H01L 23/525* (2013.01); *H01L 27/11206* (2013.01); *H01L 2924/0002* (2013.01)

(58) Field of Classification Search
  CPC ............. H01L 23/5252; H01L 23/525; H01L 27/11206; G11C 17/16; G11C 29/785; G11C 29/787
  See application file for complete search history.

(56) References Cited

U.S. PATENT DOCUMENTS

| | | | |
|---|---|---|---|
| 7,629,247 B2 | 12/2009 | Hsia et al. | |
| 8,389,399 B2 | 3/2013 | Hsia et al. | |
| 8,633,105 B2 | 1/2014 | Hsia et al. | |
| 9,082,786 B2 | 7/2015 | Hsia et al. | |
| 2008/0242028 A1* | 10/2008 | Mokhlesi et al. | 438/270 |
| 2008/0254576 A1 | 10/2008 | Hsia et al. | |
| 2009/0209076 A1 | 8/2009 | Higashi | |
| 2010/0044756 A1 | 2/2010 | Hsia et al. | |
| 2010/0140685 A1* | 6/2010 | Kang et al. | 257/324 |
| 2013/0175675 A1 | 7/2013 | Hsia et al. | |
| 2014/0117514 A1 | 5/2014 | Hsia et al. | |

FOREIGN PATENT DOCUMENTS

| | | |
|---|---|---|
| KR | 10-2010-0015477 A | 2/2010 |
| KR | 1020110008852 A | 1/2011 |

* cited by examiner

Primary Examiner — Whitney T Moore

(57) ABSTRACT

An anti-fuse based on a Field Nitride Trap (FNT) is disclosed. The anti-fuse includes a first active pillar including a first junction, a second active pillar including a second junction, a selection line buried between the first active pillar and the second active pillar, and a trap layer for electrically coupling the first junction to the second junction by trapping minority carriers according to individual voltages applied to the first junction, the second junction and the selection line. As a result, the fuse can be highly integrated through the above-mentioned structure, and programming of the fuse can be easily achieved.

13 Claims, 13 Drawing Sheets

ANTI-FUSE OF SEMICONDUCTOR DEVICE, SEMICONDUCTOR MODULE AND SYSTEM EACH INCLUDING THE SEMICONDUCTOR DEVICE, AND METHOD FOR FORMING THE ANTI-FUSE

CROSS-REFERENCE TO RELATED APPLICATION

The present application is a divisional of U.S. patent application Ser. No. 13/717,553 filed on Dec. 17, 2012, which claims priority of Korean patent application No. 10-2012-0077260 filed on Jul. 16, 2012, the disclosure of which is hereby incorporated in its entirety by reference, is claimed.

BACKGROUND OF THE INVENTION

Embodiments of the present invention relate to an anti-fuse of a semiconductor device, and more particularly to an anti-fuse using a Field Nitride Trap (FNT).

Semiconductor devices cannot be used as memory devices when a defect or failure occurs in at least one unit cell therein during a fabrication process. A memory device having at least one failed unit cell is classified as a defective product, and results in decreased production efficiency. Therefore, a technology of substituting a defective cell with a redundancy cell has been introduced so as to repair the defective cell in the memory device.

For example, if a defective cell is detected in a test operation after a memory device is fabricated, a program operation for making access to a redundancy cell with an address input to access to the defective cell is carried out in an internal circuit of the memory device. Therefore, if an address signal corresponding to a defective line used to select the defective cell is input to the memory device, a redundancy line used to select the redundancy cell is accessed instead of the defective line.

A typical repair process is designed to cut or blow a fuse. However, since a method for repairing a semiconductor device by blowing the fuse performs the repair process on a wafer level, it cannot be applied to a packaged semiconductor device. In addition, as an integration degree of the semiconductor device gradually increases, a spot size of a laser beam required for the fuse cutting may be larger than a pitch of the fuse, so that it is impossible to perform the repair process using the fuse cutting. Therefore, a new method to overcome the limitations of the above-mentioned repair method using an anti-fuse has been introduced.

The method using the anti-fuse can perform a program operation capable of easily repairing a defective cell in the packaged memory device. An anti-fuse starts with a high resistance and is designed to create an electrically conductive path typically when a voltage across the anti-fuse exceeds a certain level, whereas a fuse starts with a low resistance and is designed to break an electrically conductive path typically when a current through the path exceeds a specified limit. Generally, the anti-fuse is formed with a very thin dielectric layer of a non-conducting amorphous material between two electrical conductors.

In accordance with a program operation of the anti-fuse, a predetermined voltage is applied to the anti-fuse during a sufficient period of time such that the dielectric layer located between two conductors is broken down to program the anti-fuse. Accordingly, the anti-fuse is electrically opened in a basic status. If the anti-fuse is programmed upon receiving a high voltage, it is electrically short-circuited.

However, as the semiconductor device is highly integrated, the anti-fuse is also highly integrated.

BRIEF SUMMARY OF THE INVENTION

Various embodiments of the present invention are directed to providing an anti-fuse for a semiconductor device, a semiconductor module and system including the semiconductor device, and a method for forming the anti-fuse, thereby substantially obviating one or more problems due to limitations and disadvantages of the related art.

An embodiment of the present invention relates to an anti-fuse for easily forming a highly-integrated fuse array.

In accordance with one embodiment of the present invention, an anti-fuse for a semiconductor device includes: a first active pillar including a first junction; a second active pillar including a second junction; a selection line disposed between the first active pillar and the second active pillar; and a trap layer for electrically coupling the first junction to the second junction by trapping minority carriers according to individual voltages applied to the first junction, the second junction and the selection line.

The anti-fuse may further include: a first signal line coupled to the first junction so as to apply a first voltage to the first active pillar; and a second signal line coupled to the second junction so as to apply a second voltage to the second pillar.

The anti-fuse may further include: a first contact plug coupled between the first signal line and the first junction; and a second contact plug coupled between the second signal line and the second junction.

The first signal line and the second signal line may be directly coupled to the first junction and the second junction, respectively.

The first signal line and the second signal line may be located perpendicular to the selection line.

$P^+$ impurities are implanted into the first and second active pillar to form the first junction and the second junction, respectively.

Lower parts of the first junction and the second junction may be configured to vertically overlap with the selection line.

The trap layer may include a nitride film.

The minority carriers may be electrons.

In accordance with another embodiment of the present invention, an anti-fuse for a semiconductor device includes: first to fourth active pillars including respective junctions at their upper portions; a first selection line disposed at a lower portion of a space between the first active pillar and the second active pillar; a second selection line disposed at a lower portion of a space between the second active pillar and the third active pillar and at a lower portion of a space between the second active pillar and the fourth active pillar; a first signal line commonly coupled to the junctions of the first active pillar and the fourth active pillar; a second signal line coupled to the junction of the second active pillar; a third signal line coupled to the junction of the third active pillar; and a trap layer for electrically coupling the first to fourth active pillars by trapping minority carriers according to individual voltages applied to the first to third signal lines, the first selection line and the second selection line, wherein the trap layer is disposed between each of the first and second selection line and corresponding ones of the first and fourth active pillars.

The first to third signal lines may be located perpendicular to each of the first selection line and the second selection line.

Each junction may be implanted with $P^+$ impurities.

A lower part of each junction may be configured to vertically overlap with the first selection line and the second selection line.

The trap layer may include a nitride film.

The minority carriers may be electrons.

In accordance with another embodiment of the present invention, an anti-fuse for a semiconductor device includes: a first active pillar over which a first junction is formed; a second active pillar over which a second junction is formed; a selection line buried between the first active pillar and the second active pillar; and an insulation film configured to interconnect the first junction and the second junction, and located among the selection line, the first active pillar and the second active pillar; a selection line buried between the first active pillar and the second active pillar; a first signal line coupled to the first junction; and a second signal line coupled to the second junction.

In accordance with another embodiment of the present invention, a method for forming an anti-fuse of a semiconductor device includes: forming first and second active regions by etching a semiconductor substrate; forming a trap layer over sidewalls of the first and second active regions and the bottom of a space between the first and second active region; forming a device isolation film filling a space around the first and second active regions to define the first and second active regions; forming a trench by etching a portion of the device isolation film disposed between the first active region and the second active region; forming a selection line by filling a lower part of the trench with a conductive material; and forming a first signal line and a second signal line, which are located perpendicular to the selection line and coupled to the first active region and the second active region, respectively.

The forming of the first signal line and the second signal line may include: forming an interlayer insulation film over a resultant structure including the selection line; forming a first contact hole and a second contact hole by etching the interlayer insulation film in a manner that top surfaces of the first active region and the second active regions are exposed; forming a first contact plug and a second contact plug in the first contact hole and the second contact hole, respectively; and forming a first conductive line and a second conductive line coupled to the first contact plug and the second contact plug, respectively, the first and second conductive lines corresponding to the first and second signal lines.

The forming of the first signal line and the second signal line may include: forming an interlayer insulation film over the first active region, the second active region and the device isolation film; forming a first trench and a second trench that are configured to expose the first active region and the second active region, respectively, by etching the interlayer insulation film; and forming a conductive line to fill the first trench and the second trench.

The forming of the trap layer may include: applying different voltages to the first signal line and the second signal line; and applying a voltage equal to or less than the voltage applied to the first signal line to the selection line.

The forming of the trap layer may include: applying a VPP voltage to the first signal line, applying a VBB voltage to the second signal line, and applying a VPP or VDD voltage to the selection line.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
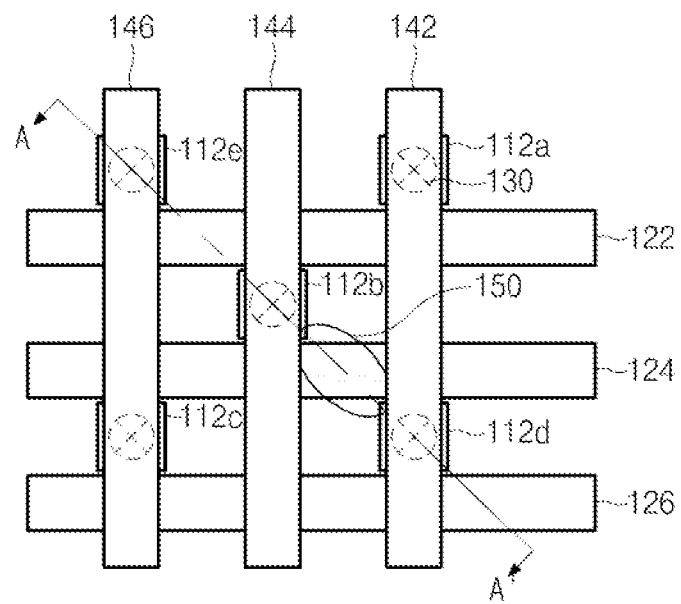
FIG. 1 illustrates a plane view of an anti-fuse according to a first embodiment of the present invention.
Figure 2:
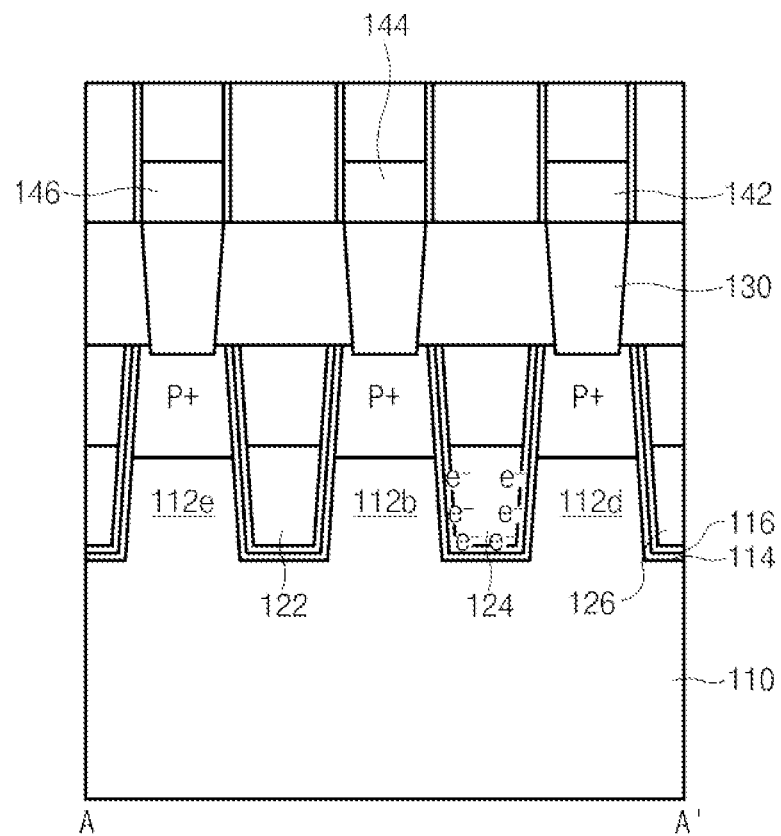
FIG. 2 illustrates a cross-sectional view of the anti-fuse taken along a line A-A' of FIG. 1.

FIG. 1 illustrates a plane view of an anti-fuse according to a first embodiment of the present invention. FIG. 2 illustrates a cross-sectional view of the anti-fuse taken along a line A-A' of FIG. 1.

Referring to FIGS. 1 and 2, the anti-fuse includes multiple island-type active regions 112a to 112e that vertically protrude from a semiconductor substrate 110 and are arranged in a zigzag manner. That is, each of the active regions 112a to 112e is formed as a pillar vertically protruding from the semiconductor substrate 110. Line-type selection lines 122 to 126 are arranged in a first direction among the active regions 112a to 112e and formed to be buried in a device isolation film (not shown). Line-type signal lines 142 to 146 are arranged in a second direction perpendicular to the first direction.

Each of the signal lines 142 to 146 is coupled to the active regions 112a to 112e through corresponding contact plugs 130, and the signal lines 142 to 146 are commonly coupled to the semiconductor substrate 110 through the active regions 112a to 112e.

The selection line 122 is formed not only between the active regions 112a and 112b diagonally contiguous to each other but also between the active regions 112b and 112e diagonally contiguous to each other. The selection line 124 is formed not only between the active regions 112b and 112c diagonally contiguous to each other but also between the active regions 112b and 112d diagonally contiguous to each other. The signal line 142 is coupled to junctions of the active region 112a and the active region 112d through corresponding contact plugs, respectively. The signal line 144 is coupled to a junction of the active region 112b through a corresponding contact plug. The signal line 146 is coupled to junctions of the active region 112c and the active region 112e through corresponding contact plugs, respectively. A junction in which $P^+$ impurities are implanted is formed at an upper portion of each of the active regions 112a to 112e coupled to the contact plug 130. An oxide film 114 and a nitride film 116 are formed not only over sidewalls of the active regions 112a to 112e but also over portions of the semiconductor substrate 110 along the active regions 112a to 112e. The oxide film 114 may be formed to have a thickness of about 5 to 100 Å, and the nitride film 116 may be formed to have a thickness of about 10 to 500 Å. The P$^+$ junction is formed to have a predetermined depth. A bottom of the P$^+$ junction may be lower than a top surface of the selection lines 122 to 126. That is, a lower part of the P$^+$ junction may vertically overlap with the selection lines 122 to 126.

The nitride film 116 is formed as a conductive path (i.e., a trap layer) so that a current can flow between the corresponding active regions, e.g., 112b and 112d. Here, the conductive path (trap layer) is configured to selectively trap electrons (e−) serving as minority carriers according to the magnitude of a program power source applied not only to the selection lines 122 to 124 but also to other signaling lines 142 to 146 at a specific position between the active regions 112b and 112d of FIG. 1.

For example, a power-supply voltage VPP, e.g., 3V, is applied to the signal line 144, and a power-supply voltage VBB, e.g., −0.8V, is applied to the signal line 142 in such a manner that a voltage difference occurs between the signal lines 144 and 142. The power-supply voltage VPP or VDD, e.g., 1.5V, is applied to the selection line 124 on the condition that current flows between P$^+$ junctions coupled to the signal lines 144 and 142. In another case, the power-supply voltage VDD is applied to the signal line 144, and a power-supply voltage VBB is applied to the signal line 142 in such a manner that a voltage difference occurs between the signal lines 144 and 142. Thus, the power-supply voltage VDD or VSS (≤GND) is applied to the selection line 124 on the condition that current flows between the P$^+$ junctions coupled to the signal lines 144 and 142. As shown in FIGS. 1 and 2, electrons (e−) are trapped in the nitride film 116 between the active regions 112b and 112d coupled to the signal lines 144 and 142, respectively, from among the active regions 112b, 112c, and 112d located at both sides of the selection line 124, so that a trap layer 150 in which current can flow can be formed.

In an embodiment of the present invention, fuse programming is performed using the internal power-supply voltages VPP, VDD, VBB, and VSS of a semiconductor device without applying an external power source to the semiconductor device.

FIGS. 3A to 3F illustrate a method for forming the antifuse of FIG. 2.

Figure 3A:
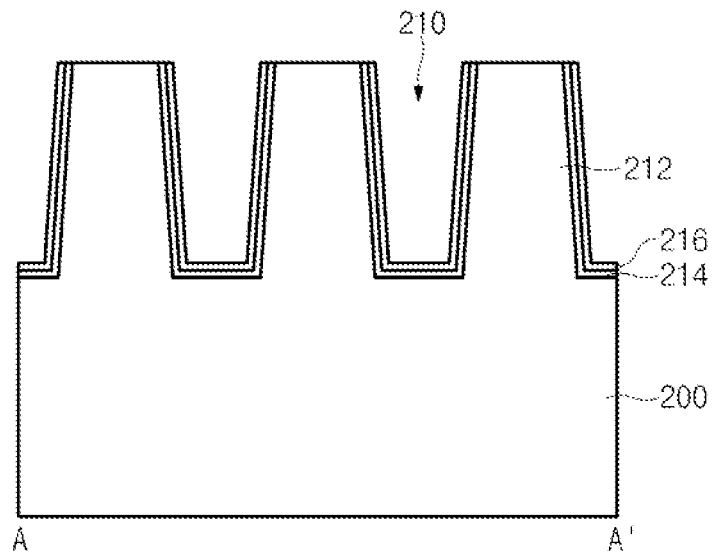
FIGS. 3A to 3F illustrate a method for forming the anti-fuse of FIG. 2.

Referring to FIG. 3A, a semiconductor substrate 200 is etched using a device-isolation mask pattern as an etch mask to form island-type active regions. As a result, a device-isolation trench 210 is formed, and thus an active region (active pillar) 212 is formed as an island-type region protruding from the etched portion of the semiconductor substrate 200.

After that, an oxide film 214 is formed over an entire surface of the semiconductor substrate 200 including the device-isolation trench 210. In an embodiment, the oxide film 214 is formed by oxidizing the semiconductor substrate 200 including the device-isolation trench 210 through a thermal or annealing process. The oxide film 214 may have a thickness of about 5 to 100 Å.

Subsequently, a liner nitride film 216 is formed over the oxide film 214. In an embodiment, the liner nitride film 216 is formed to have thickness of about 10 to 500 Å. The liner nitride film 216 may be used as a trap layer for trapping electrons (e−) that serve as minority carriers.

Figure 3B:
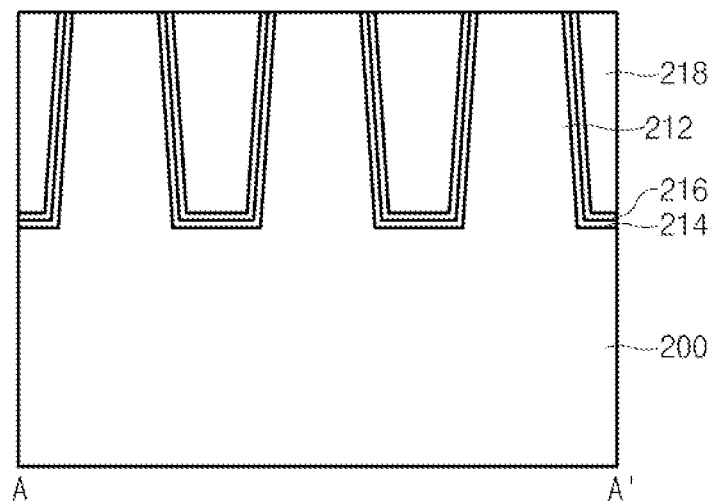

Referring to FIG. 3B, a device isolation film 218 is formed to fill the device-isolation trench 210. Here, the device isolation film 218 may include an insulation film such as an oxide film.

If the device isolation film 218 is formed of a nitride film, the device isolation film 218 remains with a predetermined thickness over the oxide film 214 when the device isolation film 218 is etched in a subsequent selection-line formation process, so that a trap layer is formed.

Figure 3C:
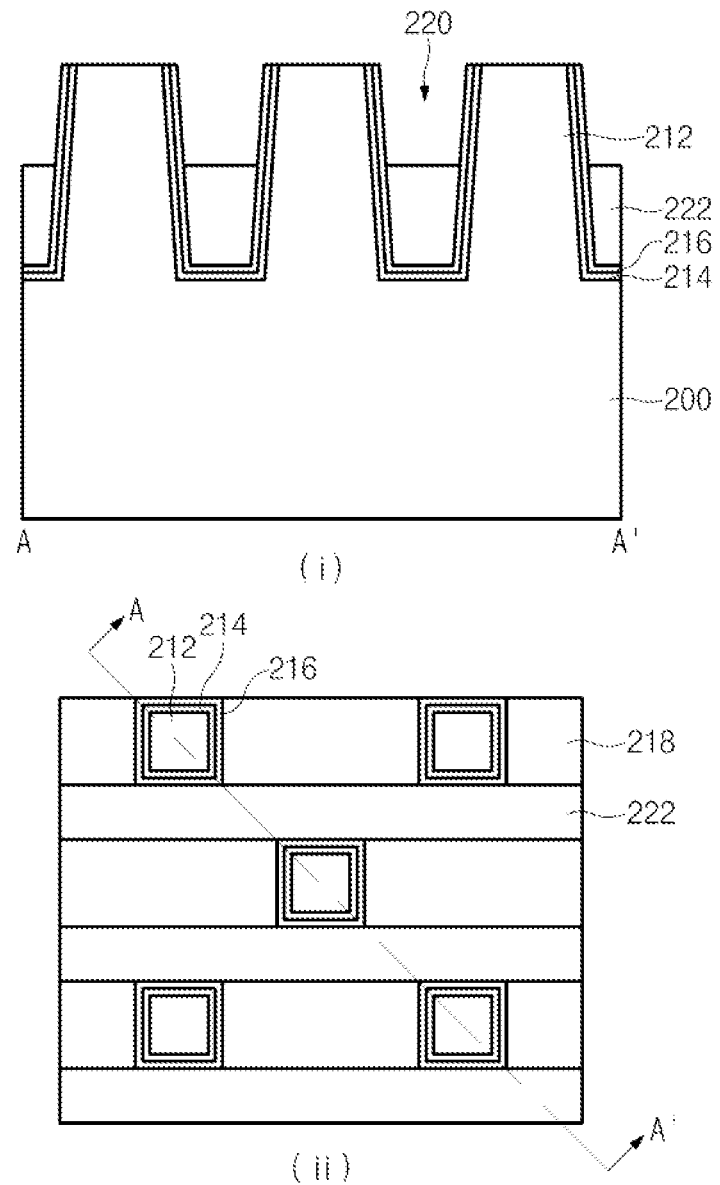

Referring to FIG. 3C, a selection-line mask pattern (not shown) defining a selection line region is formed over the active region 212 and the device isolation film 218. That is, as can be seen from a plane view (ii) of FIG. 3C, the selection-line mask pattern is formed to expose the device isolation film 218 disposed between the active regions 212 in a line type along a first direction.

Subsequently, the device isolation film 218 is etched using the selection-line mask pattern as an etch mask, so that a line-type trench 220 is formed. A conductive material is formed to fill the trench 220, and then etched back, so that a selection line 222 having a predetermined thickness is formed at a lower part of the trench 220 as shown in a cross-sectional view (ii) of FIG. 3C. Here, the selection line 222 may be formed of a laminate structure of a barrier metal layer and a metal layer. In more detail, the barrier metal layer including titanium (Ti) or titanium nitride (TiN) is deposited over an inner surface of the trench 220, and the metal layer including tungsten (W) or tungsten nitride (WN) is deposited over the barrier metal layer so as to fill the trench 220. After that, the barrier metal layer and the metal layer are etched back, so that the selection line 222 is formed at the lower part of the trench 220.

Figure 3D:
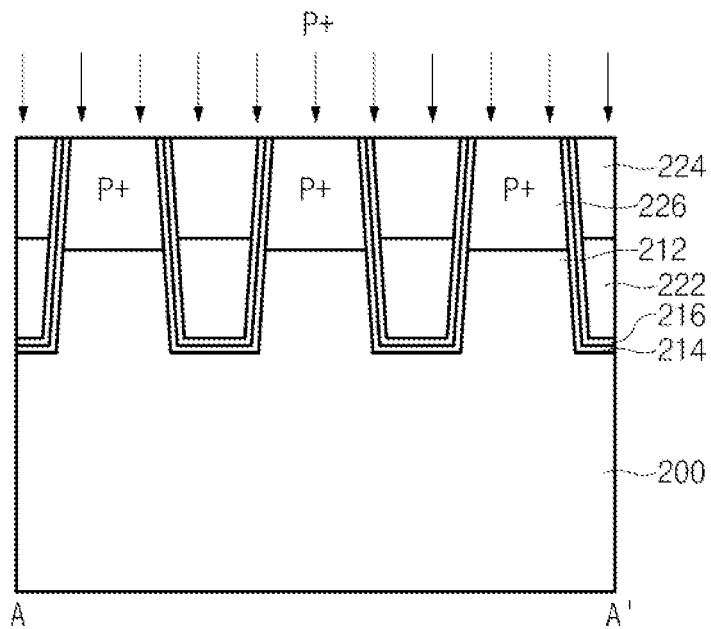

Referring to FIG. 3D, a capping nitride film 224 is formed over the selection line 222 by depositing a nitride film over a resultant structure of FIG. 3C and planarizing the nitride film through a chemical mechanical polishing (CMP) process until a top surface of the active region 212 is exposed. In an embodiment, the top surface of the active region 212 is oxidized so that an oxide film (not shown) may be formed.

Then, P$^+$ impurities such as BF$_2$, B$_2$H$_6$, B$^+$, or BF$_3$, are implanted into the active region 212, so that a P$^+$ junction 226 is formed at an upper portion of the active region 212. In an embodiment, the P$^+$ junction 226 is formed to have a thickness that is greater than that of the capping nitride film 224. As a result, a lower part of the P$^+$ junction 226 may vertically overlap with the selection line 222.

Figure 3E:
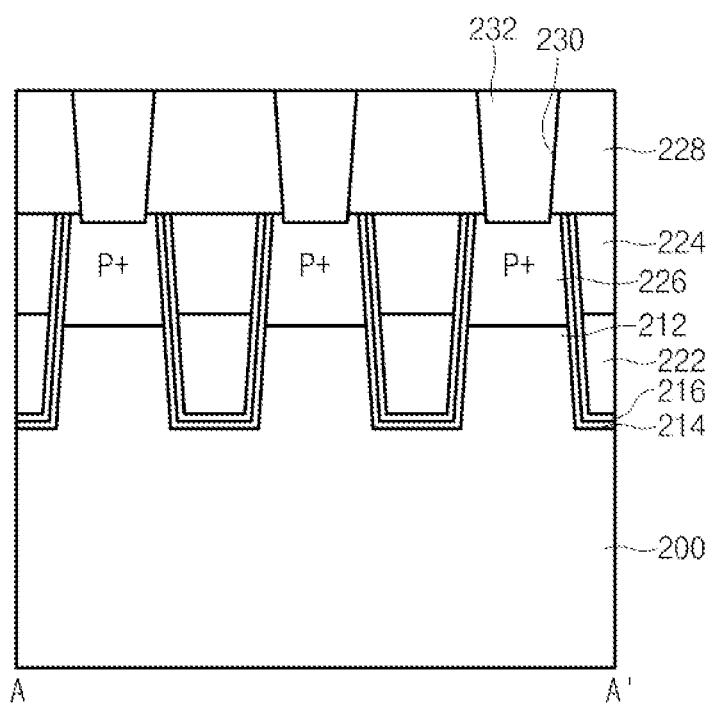

Referring to FIG. 3E, an interlayer insulation film 228 is formed over the active region 212 and the capping nitride film 224. Subsequently, a contact hole 230 is formed to expose a top surface of the P$^+$ junction 226 of the active region 212.

After that, a contact plug 232 is formed to fill the contact hole 230 by, e.g., depositing a conductive material over a resultant structure including the contact hole 230 and planarizing the conductive material layer until the interlayer insulation film 228 is exposed. In an embodiment, the contact plug 232 includes a metal plug. The planarization process may include a CMP process.

Figure 3F:
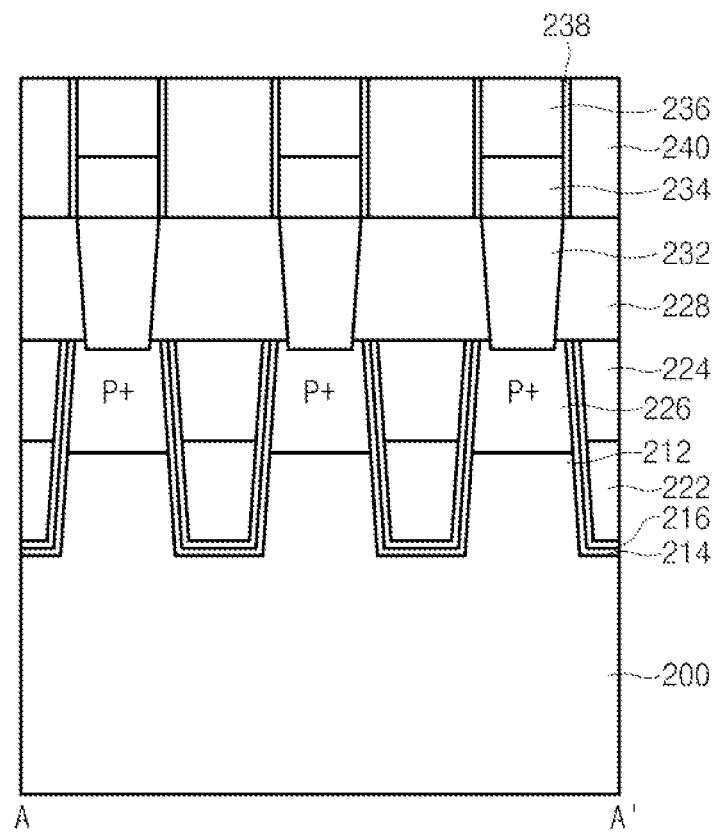

Referring to FIG. 3F, a conductive layer (not shown) and a hard mask layer (not shown) are sequentially deposited over the interlayer insulation film 228 and the contact plug 232. In an embodiment, the conductive layer includes a metal material such as Ti/TiN or W, and the hard mask layer includes a nitride film.

Subsequently, the conductive layer and the hard mask layer are patterned so that a line-type signal line 234 and a hard mask pattern 236 are formed to be coupled to the contact plug 232. Like the signal lines 142 to 146 in FIG. 1, the line-type signal line 234 and the hard mask pattern 236 are formed to be perpendicular to the selection line 222.

After that, a spacer insulation film (not shown) is deposited over the interlayer insulation film 228, the signal line 234, and the hard mask pattern 236, and then etched back, so that a spacer 238 is formed on sidewalls of the signal line 234 and the hard mask pattern 236. Subsequently, an interlayer insulation film 240 is formed over the interlayer insulation film 228, the spacer 238, and the hard mask pattern 236, and then planarized until the hard mask pattern 236 is exposed. The interlayer insulation film 240 fills a space disposed between two neighboring signal lines 234 and a space disposed between two neighboring hard mask patterns 236.

Figure 4:
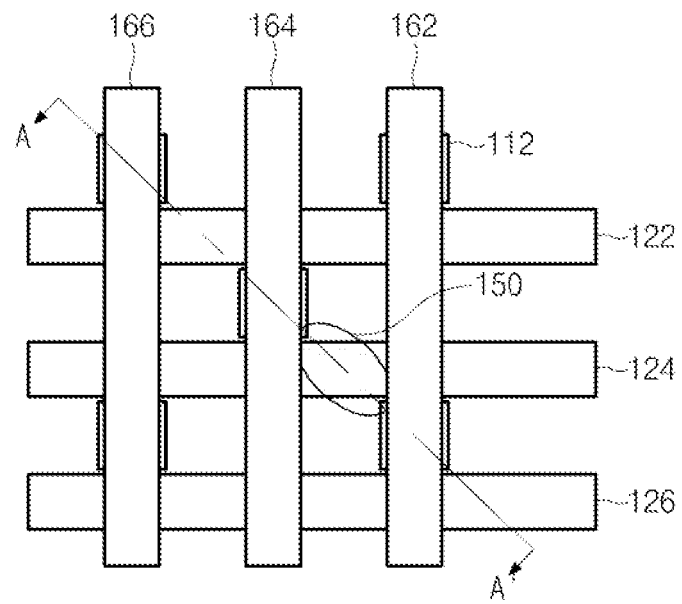
FIG. 4 illustrates a plane view of an anti-fuse according to a second embodiment of the present invention.
Figure 5:
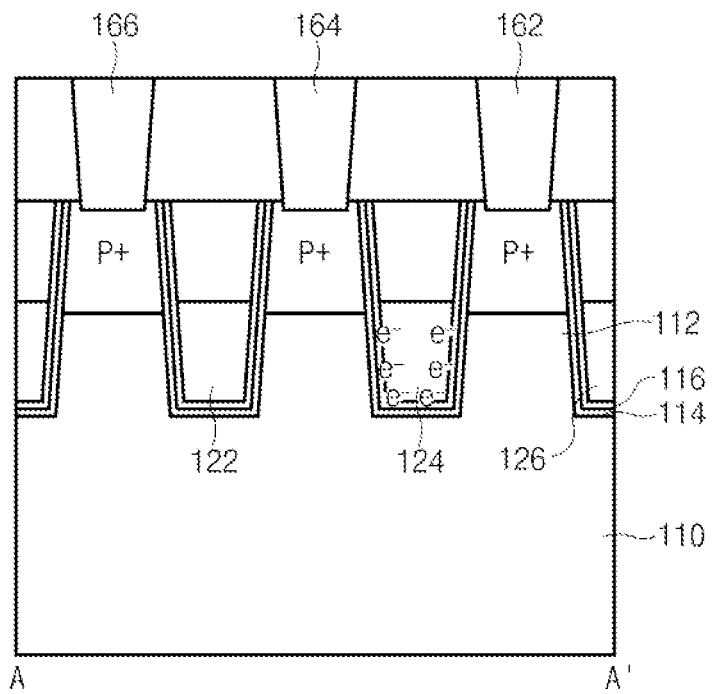
FIG. 5 illustrates a cross-sectional view of the anti-fuse taken along a line A-A' of FIG. 4.

FIG. 4 illustrates a plane view of an anti-fuse according to a second embodiment of the present invention. FIG. 5 illustrates a cross-sectional view of the anti-fuse taken along a line A-A' of FIG. 4. In FIGS. 4 and 5, the same elements as those of FIGS. 1 and 2 are designated by the same reference numerals for convenience of description, and detailed description thereof will be omitted.

Differently from the first embodiment, signal lines 162 to 166 of the second embodiment are brought into contact with the active region 112.

That is, while the signal lines 142 to 146 of the first embodiment are coupled to the active region 112 through the contact plug 130, the signal lines 162 to 166 of the second embodiment are in direct contact with the active region 112.

Figure 6A:
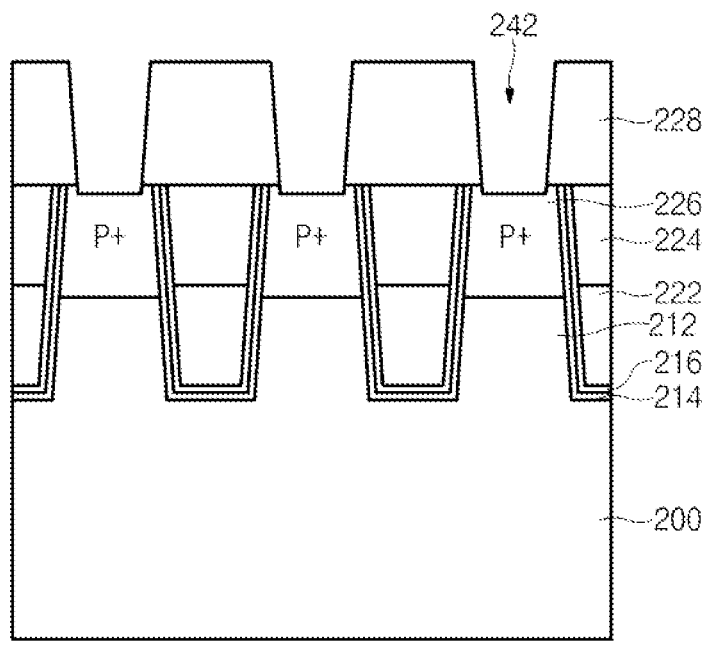
FIGS. 6A and 6B illustrate a method for forming the anti-fuse of FIG. 5.
Figure 6B:
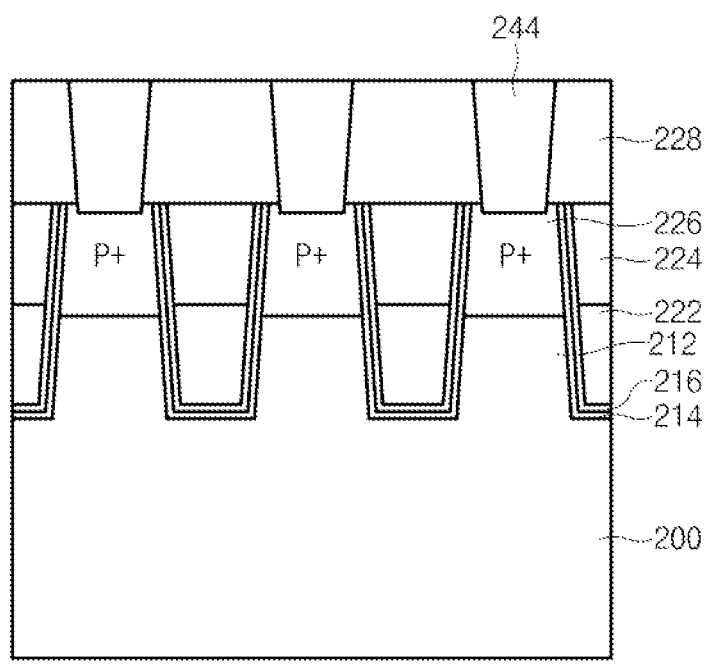

FIGS. 6A and 6B illustrate a method for forming the anti-fuse of FIG. 5. In FIGS. 6A and 6B, the same elements as those of FIGS. 3A to 3D are designated by the same reference numerals for convenience of description, and detailed description thereof will be omitted.

Likewise in FIGS. 3A to 3D, the selection line 222 arranged as a line type along the first direction is formed between the active regions 212, and the P+ junction 226 is formed at the upper portion of the active region 212.

Referring to FIG. 6A, the interlayer insulation film 228 is formed over the P+ junction 226 of the active region 212 and the capping nitride film 224.

A mask pattern (not shown) defining signal lines 162 to 166 of FIG. 4 is formed over the interlayer insulation film 228 using a typical photolithographic process. Subsequently, the interlayer insulation film 228 is etched using the mask pattern as an etch mask until the top surface of the P+ junction 226 is exposed, so that a line-type trench 242 is formed to be perpendicular to the selection line 222.

Referring to FIG. 6B, after a conductive layer (not shown) is formed to fill the trench 242, the conductive layer is planarized until the interlayer insulation film 228 is exposed, so that a signal line 244 is formed to be buried in the interlayer insulation film 228. That is, the signal line 244 is formed in the interlayer insulation film 228 using a damascene process in such a manner that the signal line 244 is contact with the P+ junction 226 of the active region 212.

As can be seen from the first or second embodiment, if the anti-fuse is formed, a program power-supply voltage is applied to the signal line and the selection line, so that electrons are trapped into a trap layer between contiguous active regions.

In the structures of FIGS. 1 and 2, different power-supply voltages are applied to signal lines 142 and 144 coupled to the active regions 112a, 112b, and 112d, and thus the trap layer 150 is formed between the signals lines 142 and 144, so that current flows between the P+ junctions coupled to the signal lines 144 and 142. In an embodiment, holes are used as majority carriers, and electrons are used as minority carriers. In an embodiment, if a voltage equal to or lower than the voltage applied to the signal line 142 is applied to the selection line 124, electrons acting as the minority carriers are trapped in the trap layer (nitride film) 150 formed between the corresponding active regions 112b and 112d.

Figure 7:
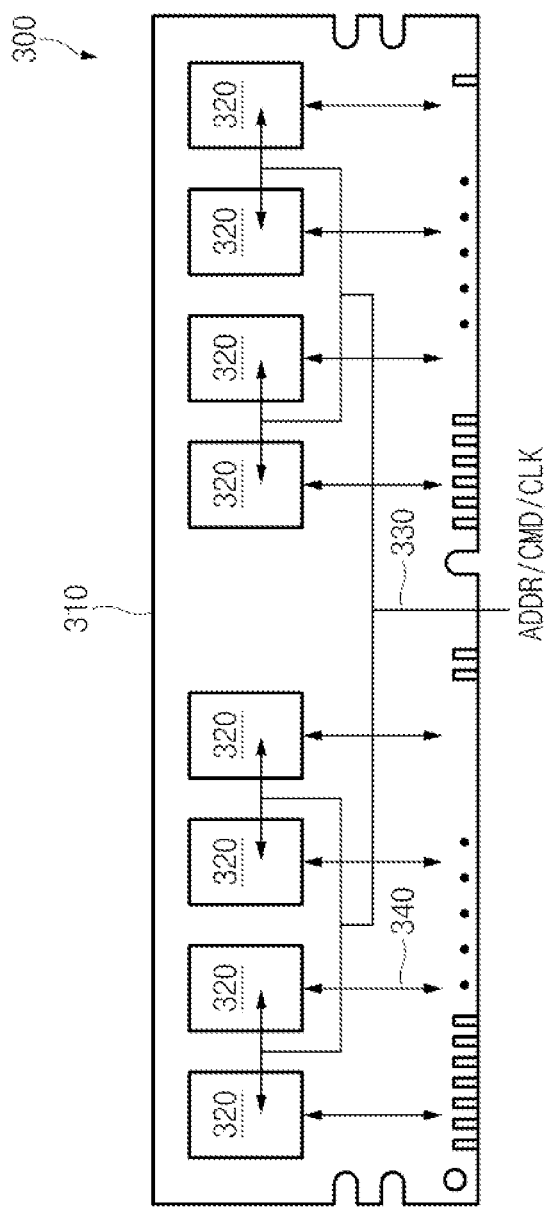
FIG. 7 illustrates a circuit diagram illustrating a semiconductor module according to an embodiment of the present invention.

FIG. 7 illustrates a circuit diagram of a semiconductor module according to an embodiment of the present invention.

Referring to FIG. 7, the semiconductor module 300 includes a plurality of semiconductor devices 320 mounted to a module substrate 310, a command link 330 for enabling each semiconductor device 320 to receive control signals (for example, an address signal ADDR, a command signal CMD, and a clock signal CLK) from an external controller (not shown), and a data link 340 coupled to each semiconductor device 320 so as to transmit input/output (I/O) data.

In an embodiment, the semiconductor device 320 may include a fuse for repairing a defect of a cell array therein. The fuse may include an anti-fuse shown in FIG. 1 or 4.

The command link 330 and the data link 340 may be identical or similar to those of a general semiconductor module.

Although the semiconductor devices 320 are exemplarily mounted to a front surface of the module substrate 310 as shown in FIG. 7, it should be noted that the semiconductor devices 320 may also be mounted to a back surface of the module substrate 310. That is, the semiconductor devices 320 may be mounted to one side or both sides of the module substrate 310, and the number of mounted semiconductor devices 320 is not limited to an example shown in FIG. 7. In addition, a material and a structure of the module substrate 310 are not limited thereto.

Figure 8:
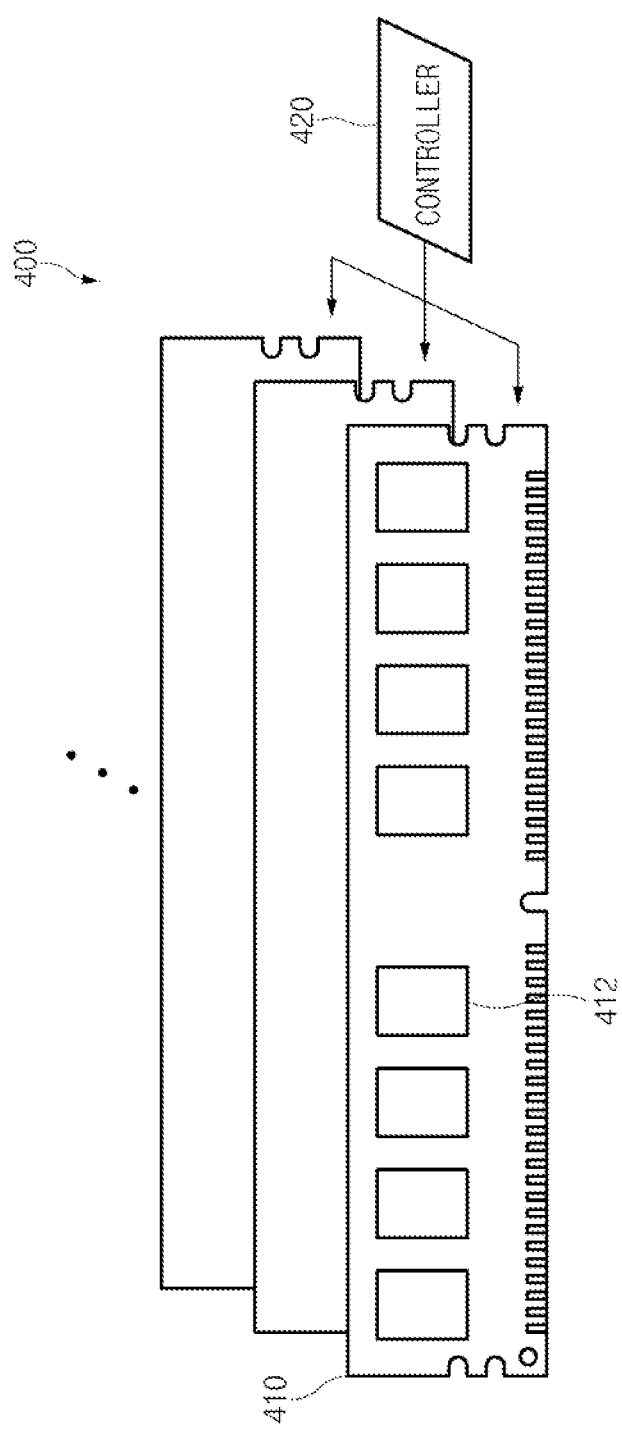
FIG. 8 illustrates a circuit diagram of a semiconductor system according to an embodiment of the present invention.

FIG. 8 illustrates a circuit diagram of a semiconductor system according to an embodiment of the present invention.

Referring to FIG. 8, the semiconductor system 400 includes at least one semiconductor module 410 including a plurality of semiconductor devices 412 and a controller 420 for controlling operations of the semiconductor module 410 by providing a bidirectional interface between the semiconductor module 410 and an external system (not shown).

The controller 420 may be functionally identical or similar to a controller for controlling operations of a plurality of semiconductor modules of a general data processing system, and detailed description thereof will be omitted for convenience of description and better understanding of the present invention.

In an embodiment, the semiconductor module 410 includes the semiconductor module 300 shown in FIG. 7.

Figure 9:
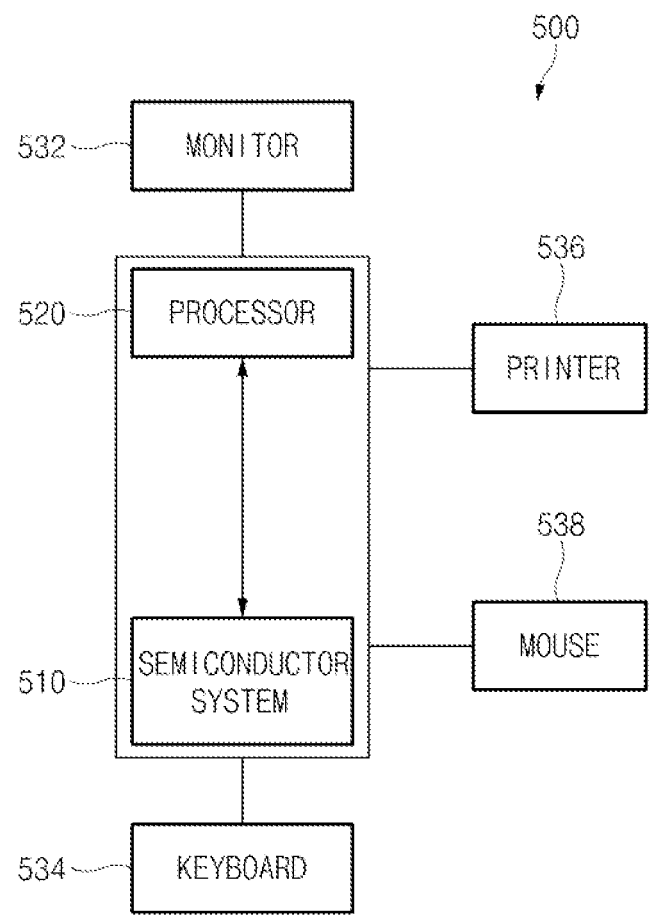
FIG. 9 illustrates a block diagram of a computer system according to an embodiment of the present invention.

FIG. 9 illustrates a block diagram of a computer system according to an embodiment of the present invention.

Referring to FIG. 9, the computer system 500 includes a semiconductor system 510 and a processor 520, e.g., a central processing unit (CPU).

The semiconductor system 510 stores data needed for controlling the computer system 500. In an embodiment, the semiconductor system 510 includes the semiconductor system 400 shown in FIG. 8.

The processor 520 controls the computer system 500 by processing the data stored in the semiconductor system 510. The processor 520 may be functionally identical or similar to a CPU of a general computer system.

The computer system 500 may further include a variety of user interface (UI) devices, for example, a monitor 532, a keyboard 534, a printer 536, a mouse 538, etc.

Figure 10:
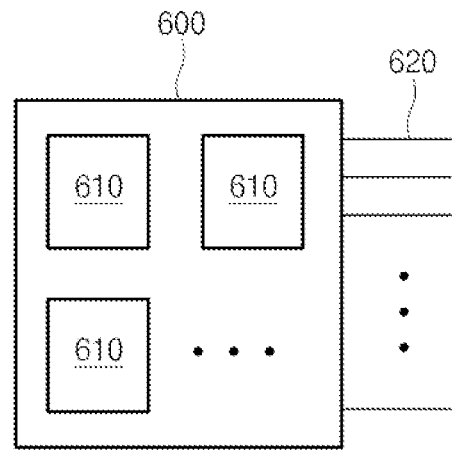
FIG. 10 illustrates a block diagram of a data processing system according to an embodiment of the present invention.

FIG. 10 illustrates a block diagram of a data processing system according to an embodiment of the present invention.

Referring to FIG. 10, the data processing system 600 is mounted to an electronic system (not shown) so that it can perform a plurality of functions of the electronic system.

The data processing system 600 includes at least one semiconductor device 610 mounted to a substrate.

The semiconductor device 610 includes a cell array (not shown) for storing data needed for performing a specific function of the electronic system, and a processor (not shown) for performing the corresponding specific function by processing the data stored in the cell array. That is, the semiconductor device 610 includes a unit for storing data in a single unit element (die or chip) and a unit for performing a specific function by processing the stored data. The semiconductor device 610 may include a fuse for repairing a defect of the cell array. In an embodiment, the fuse may include an anti-fuse shown in FIG. 1 or 4.

The data processing system 600 is coupled to other constituent elements (for example, CPUs) of the electronic system through leads 620, such that it can unidirectionally or bidirectionally transmit/receive data and control signals to/from the coupled constituent elements.

Figure 11:
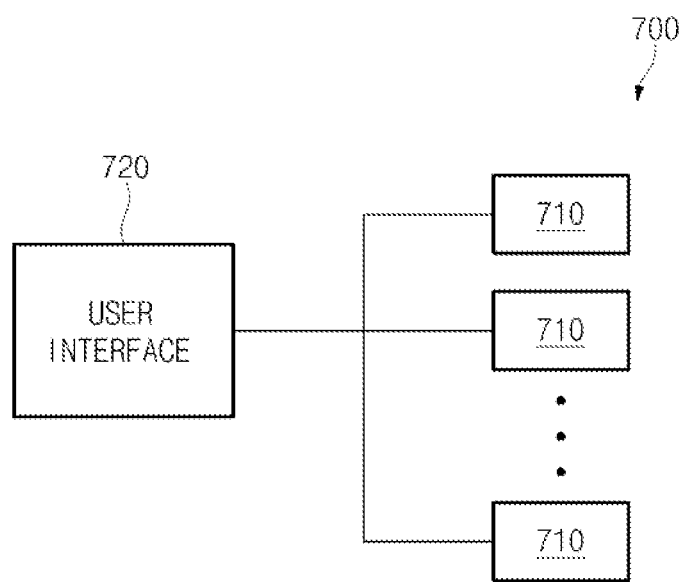
FIG. 11 illustrates a block diagram of an electronic system according to one embodiment of the present invention.

FIG. 11 illustrates a block diagram of an electronic system according to an embodiment of the present invention.

Referring to FIG. 11, the electronic system 700 includes at least one data processing system 710 and a user interface 720.

The data processing system 710 performs a plurality of functions of the electronic system 700, and includes at least one semiconductor device mounted to the substrate. The semiconductor device includes a cell array (not shown) for storing data needed for performing a specific function of the electronic system 700, and a processor (not shown) for controlling the corresponding function by processing the data stored in the cell array. In an embodiment, the data processing system 710 includes the data processing system of FIG. 10.

The user interface (UI) 720 provides an interface between a user and the data processing system 710. The user interface 720 may include a keypad, a touchscreen, a speaker, etc. incorporated into the electronic system 700.

The electronic system 700 may include a variety of embedded systems included in various electronic, information, and communication devices such as computers, household appliances, factory automation systems, elevators, mobile phones, etc.

As is apparent from the above description, according to the embodiments of the present invention, the fuse or the fuse array capable of being highly integrated can be easily formed, so that programming of the fuse can be achieved using only an internal power source without using an external power source.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor devices. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. An anti-fuse for a semiconductor device, the anti-fuse comprising:
    a plurality of active pillars arranged in a zigzag pattern when viewed in a plan view and including first to fourth active pillars, the first to fourth active pillars including respective junctions at their upper portions, the second active pillar being diagonally contiguous to the first active pillar;
    a first selection line disposed at a lower portion of a space between the first active pillar and the second active pillar;
    a second selection line disposed at a lower portion of a space between the second active pillar and the third active pillar and at a lower portion of a space between the second active pillar and the fourth active pillar;
    a first signal line commonly coupled to the junctions of the first active pillar and the fourth active pillar;
    a second signal line coupled to the junction of the second active pillar;
    a third signal line coupled to the junction of the third active pillar; and
    a trap layer electrically coupling the first to fourth active pillars by trapping minority carriers according to individual voltages applied to the first to third signal lines, the first selection line, and the second selection line,
    wherein the trap layer is disposed between each of the first and second selection lines and corresponding ones of the first and fourth active pillars, and the trap layer is disposed on first and second sidewalls of the first active pillar, first and second sidewalls of the second active pillar, and a surface of a substrate between the first active pillar and the second active pillar.

2. The anti-fuse according to claim 1, wherein the first to third signal lines are located perpendicular to each of the first selection line and the second selection line.

3. The anti-fuse according to claim 1, wherein the junction of each of the first to fourth active pillars includes P-type impurities.

4. The anti-fuse according to claim 1, wherein a lower part of each of the junctions of the first to fourth active pillars is configured to vertically overlap with the first selection line or the second selection line.

5. The anti-fuse according to claim 1, wherein the trap layer includes a nitride film.

6. The anti-fuse according to claim 1, wherein the minority carriers are electrons.

7. The anti-fuse according to claim 1, further comprising a fifth active pillar,
    wherein the first active pillar is contiguous to the fifth active pillar in a first direction,
    wherein the first active pillar is contiguous to the fourth active pillar in a second direction perpendicular to the first direction,
    wherein the fourth active pillar is contiguous to the third active pillar in the second direction, and
    wherein the second active pillar is diagonally contiguous to the third active pillar, the fourth active pillar, and the fifth active pillar.

8. The anti-fuse according to claim 1, wherein the first and second selection lines extend in a first direction, and wherein one of the first and second sidewalls of the first active pillar and one of the first and second sidewalls of the second active pillar are non-parallel to the first direction.

9. A semiconductor module, comprising:
a plurality of semiconductor devices mounted to a substrate, each semiconductor device including an anti-fuse,
wherein the anti-fuse includes:
    a plurality of active pillar arranged in a zigzag pattern when viewed in a plan view and including first and second active pillars, the first active pillar including a first junction at an upper portion, the second active pillar including a second junction at an upper portion;
    a selection line disposed at a lower portion of a space between the first active pillar and the second active pillar; and
    a trap layer electrically coupling the first junction to the second junction by trapping minority carriers according to individual voltages applied to the first junction, the second junction, and the selection line, wherein the trap layer is disposed between the selection line and each of the first and second active pillars, and wherein the trap layer is disposed on first and second sidewalls of the first active pillar, first and second sidewalls of the second active pillar, and a surface of a substrate between the first active pillar and the second active pillar.

10. The semiconductor module according to claim 9, wherein the second active pillar is diagonally contiguous to the first active pillar.

11. The semiconductor module according to claim 10, wherein the selection line extends in a first direction, and wherein one of the first and second sidewalls of the first active pillar and one of the first and second sidewalls of the second active pillar are non-parallel to the first direction.

12. A system, comprising:
a semiconductor module including a plurality of semiconductor devices each of which includes an anti-fuse,
wherein the anti-fuse includes:
    a plurality of active pillar arranged in a zigzag pattern when viewed in a plan view and including first and second active pillars, the first active pillar including a first junction at an upper portion, and the second active pillar including a second junction at an upper portion, the second active pillar being diagonally contiguous to the first active pillar;
    a selection line disposed at a lower portion of a space between the first active pillar and the second active pillar; and
    a trap layer electrically coupling the first junction to the second junction by trapping minority carriers according to individual voltages applied to the first junction, the second junction, and the selection line,
wherein the trap layer is disposed between the selection line and each of the first and second active pillars, and wherein the trap layer is disposed on first and second sidewalls of the first active pillar, first and second sidewalls of the second active pillar, and a surface of a substrate between the first active pillar and the second active pillar.

13. The system according to claim 12, wherein the selection line extends in a first direction, and
wherein one of the first and second sidewalls of the first active pillar and one of the first and second sidewalls of the second active pillar are non-parallel to the first direction.

* * * * *